United States Patent [19]
Boyko et al.

[11] Patent Number: 5,830,374
[45] Date of Patent: Nov. 3, 1998

[54] METHOD FOR PRODUCING MULTI-LAYER CIRCUIT BOARD AND RESULTING ARTICLE OF MANUFACTURE

[75] Inventors: Christina Marie Boyko, Conklin; John Matthew Lauffer, Waverly, both of N.Y.; Ronnie Charles McHatton, Atlanta, Ga.; Issa Said Mahmoud, deceased, late of Austin, Tex., by Jane C. Mahmoud, legal representative

[73] Assignee: International Business Machines Corporation, Armonk, N.Y.

[21] Appl. No.: 708,448

[22] Filed: Sep. 5, 1996

[51] Int. Cl.6 ...................................................... H05K 3/00
[52] U.S. Cl. .............................. 216/13; 438/400; 438/416
[58] Field of Search ............................. 216/13; 438/400, 438/416

[56] References Cited

U.S. PATENT DOCUMENTS

| | | | |
|---|---|---|---|
| 4,394,419 | 7/1983 | Konicek | 428/416 |
| 4,503,112 | 3/1985 | Konicek | 428/216 |
| 4,679,122 | 7/1987 | Belke, Jr. et al. | 361/414 |
| 4,711,804 | 12/1987 | Burgess | 428/210 |
| 4,830,691 | 5/1989 | Kida et al. | 156/631 |
| 4,882,454 | 11/1989 | Peterson et al. | 174/68.5 |
| 4,916,260 | 4/1990 | Broaddus et al. | 174/268 |
| 5,142,775 | 9/1992 | Wiley | 29/852 |
| 5,153,986 | 10/1992 | Brauer et al. | 29/846 |
| 5,229,550 | 7/1993 | Bindra et al. | 174/262 |
| 5,231,751 | 8/1993 | Sachdev et al. | 29/852 |
| 5,320,919 | 6/1994 | Azuma et al. | 428/546 |

*Primary Examiner*—Susan A. Loring
*Attorney, Agent, or Firm*—Jenkens & Gilchrist; Michele A. Mobley

[57] ABSTRACT

A method for producing a layer of a multi-layer electronic circuit package and resulting article of manufacture is provided comprising the steps of selecting a core material from one of three iron/nickel alloys, namely either (i) 58% Fe/42% Ni; (ii) 60% Fe/39% Ni/1% Cu; or (iii) 60% Fe/38.7% Ni/0.12% Mn/0.07% Si; forming the core material into a panel suitable for an intended application; cleaning the panel in preparation for plating; plating the panel with copper; subjecting the plated panel to heat treatment; and circuitizing the panel as appropriate for the intended application.

13 Claims, 1 Drawing Sheet

5,830,374

METHOD FOR PRODUCING MULTI-LAYER CIRCUIT BOARD AND RESULTING ARTICLE OF MANUFACTURE

TECHNICAL FIELD OF THE INVENTION

The present invention relates to a method for producing a multi-layer circuit board having an iron-nickel alloy as a core material and the resulting article of manufacture. More particularly, the invention relates to selecting the core material, forming the core material into panels and cleaning the resulting panels. The panels are then plated in an acid or copper plating bath and treated with heat. The copper plated panels then are circuitized using dielectric polymers and vias are plated. By repeating these steps, additional layers can be added to form a multi-layer electronic circuit package.

BACKGROUND OF THE INVENTION

Electronic circuits contain many (sometimes millions) of components such as resistors, capacitors, inductors, diodes, electromechanical switches, and transistors. High density packaging of electronic components is particularly important to allow fast access to large amounts of data in computers. High density electronic circuit packages also are important in high frequency devices and communications devices. The components are connected to form circuits and circuits are connected to form functioning devices. The connections perform power and signal distribution. In a multi-layer electronic circuit package, some layers of the package serve as power planes and other layers serve as signal planes, depending on the operational requirements of the device. The devices require mechanical support and structural protection. The circuits themselves require electrical energy to function. The functioning devices, however, produce heat, or thermal energy which must be dissipated so that the devices do not stop functioning. Moreover, while high density packaging of a number of components can improve performance of the device, the heat produced by the power-consuming components can be such that performance and reliability of the devices is adversely impacted. The adverse impact arises from electrical problems such as increased resistivity and mechanical problems such as thermal stress caused by increased heat.

A further heat-related issue is that the heat will cause the components and the electronic circuit package to expand. Where there is a difference in the coefficient of thermal expansion of the components compared to the electronic circuit package material (as there usually is), the solder joint between each component and the electronic circuit package will be stressed.

High density packages necessarily involve increased wiring density and thinner dielectric coatings between layers in a multi-layer electronic circuit package. The layers in a multi-layer package are electrically connected by vias and through-holes. The term "via" is used for a conductive pathway between adjacent layers in a multi-layer electronic circuit package. The term "through-hole" is used for a conductive pathway that extends to a non-adjacent layer. For high density packages the through-holes are increasingly narrow in diameter and the through-holes in each layer must be aligned precisely.

Electronic circuit packages, such as chips, modules, circuit cards, circuit boards, and combinations of these, thus must meet a number of requirements for optimum performance. The package must be structurally sturdy enough to support and protect the components and the wiring. In addition, the package must be capable of dissipating heat and must have a coefficient of thermal expansion that is compatible with that of the components. Finally, to be commercially useful, the package should be inexpensive to produce and easy to manufacture.

The prior art contains many examples of electronic circuit packages. These packages can be generally classified into packages with either a ceramic dielectric coating between layers or those with a polymeric dielectric coating between layers. One type of polymeric package is a metal core package—namely a package with aluminum, copper, molylbdenum, or copper-Invar-copper as the core, which is then encapsulated in a polymeric dielectric. Metal cores are particularly attractive since they are useful in dissipating the heat generated by the components and wiring mounted on the board. Metal cores also have the mechanical strength needed to hold the components. For a discussion of the aluminum metal core, see Belke, et al., U.S. Pat. No. 4,679,122. The copper-Invar-copper metal core is particularly widely used in the industry. Invar is a registered trademark of Imphy S.A. of Paris, France for an iron/nickel alloy that is 64% iron by weight and 36% nickel by weight.

There are several disadvantages, however, associated with the copper-Invar-copper metal core. These include first, that exposed Invar at the edges and corners of the package is susceptible to corrosion which can cause manufacturing problems and problems once the electronic circuit package is in use. Second, the copper-Invar-copper core has a sandwich-like construction which suffers from adhesion and delamination problems. Third, the copper-Invar-copper core is expensive to produce due to the various metallurgical operations needed to produce it. Fourth, the copper-Invar-copper core is not widely manufactured and thus is priced higher than would be a material available from a number of sources, which increases the manufacturing cost for electronic circuit packages with a copper-Invar-copper metal core.

SUMMARY OF THE INVENTION

It is an object of this invention to provide a method for producing a low cost, and thermally conductive metal core with a low coefficient of thermal expansion suitable for high density electronic circuit packaging.

A further object of this invention is to provide a method for producing an electronic circuit package containing a metal core that has a low coefficient of thermal expansion, is thermally conductive, and is inexpensive to produce.

A third object of this invention is to provide an article of manufacture known as an electronic circuit package that contains a metal core with a low coefficient of thermal expansion, that is thermally conductive, and is inexpensive to produce.

Accordingly, a method for producing a layer of a multi-layer electronic circuit package and resulting article of manufacture is provided comprising the steps of selecting a core material from one of three iron/nickel alloys, namely either (i) 58% Fe/42% Ni; (ii) 60% Fe/39% Ni/1% Cu; or (iii) 60% Fe/38.7% Ni/0.12% Mn/0.07% Si; forming the core material into a panel suitable for an intended application; cleaning the panel in preparation for plating; plating the panel with copper; subjecting the plated panel to heat treatment; and circuitizing the panel as appropriate for the intended application.

It is an advantage of the present invention that the metal core provided is thermally conductive and has a coefficient of thermal expansion suitable for high density electronic circuit packages. Moreover, the metal core is widely available and therefore is available at low cost.

It is a further advantage that the electronic circuit packaging method of the present invention yields a layer suitable for use in a multi-layer electronic circuit package that is inexpensive to produce and contains a metal core that is thermally conductive and has a low coefficient of thermal expansion.

If is a further advantage of the invention that the metal core serves as the cathode during plating of the metal core with a material such as copper.

It is a further advantage of the invention that the plating process disclosed can result in solid vias and through-holes.

It is a further advantage of the invention that the metal core itself can be used as a power plane in a multi-layer electronic circuit package.

Other features and advantages of the present invention will become apparent in the following detailed description of the preferred embodiment of the invention taken in conjunction with the accompanying drawings.

DETAILED DESCRIPTION OF A PREFERRED EMBODIMENT OF THE INVENTION

Figure 1:
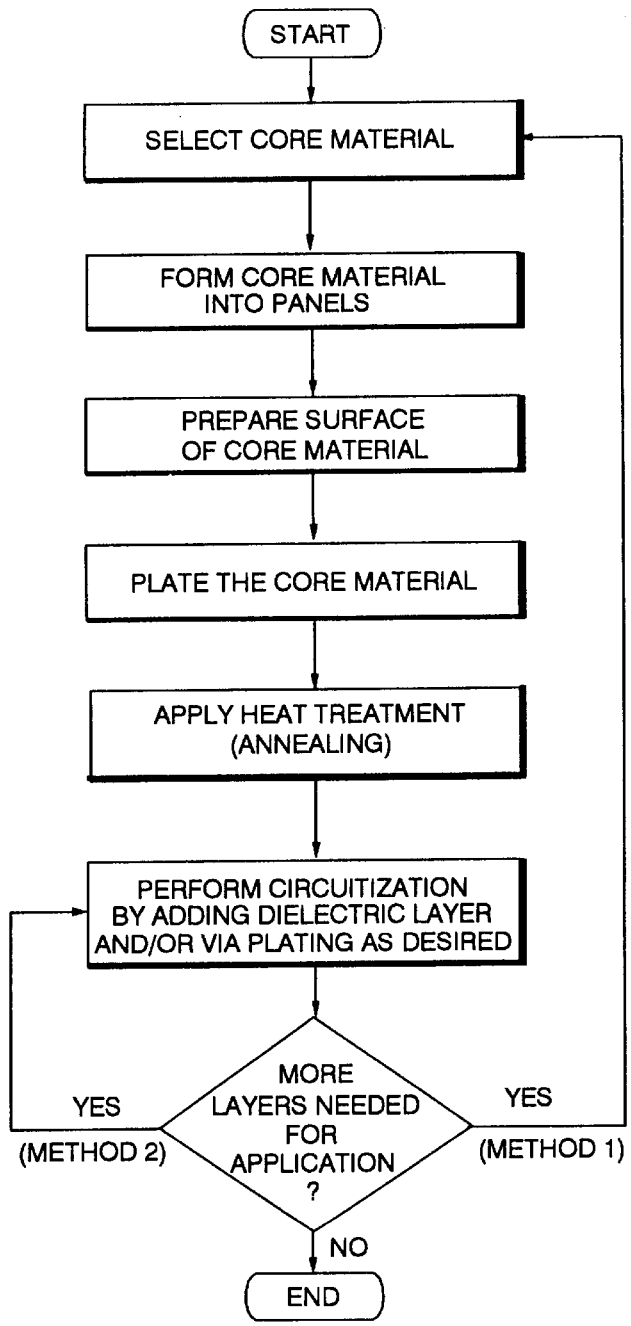
FIG. 1 is a flow chart showing the steps in the preferred embodiment of the method for producing a multi-layer circuit board of the present invention.

The present invention is of a method for producing an electronic circuit package. FIG. 1 summarizes the steps involved in the method. In the first step, the core material is selected from one of the following iron-nickel alloys:

(1) 58% Fe/42% Ni (known as alloy 42);

(2) 60% Fe/39% Ni/1% Cu (known as alloy 39); or (3) 60% Fe/38.7% Ni/0.12% Mn/0.07% Si.

Each of these alloys has a low coefficient of thermal expansion which is desirable in high density electronic packaging. The coefficient of thermal expansion (CTE) for the alloys ranges from 2.5 to 3.3 ppm. Each of these alloys is commercially available in a number of forms, including panels, sheets, foils and coils. The core material typically will be 0.001" to 0.030" in thickness. A particular alloy may be chosen for a given application based on desired CTE, or other mechanical and electrical properties.

Because the core material is widely available commercially, the present invention yields an electronic circuit package that is more cost effective to produce than the copper-Invar-copper package of the prior art.

In the second step, the core material is formed into panels suitable for the intended application. In general terms, the panels are cut to size, drilled, etched, and/or punched as needed for the intended application. If selective plating is desired, a photo resist or plating mask is applied during this step. The masking operation leaves part of the core material unplated to be used for direct chip attach. Direct chip attach reduces the chip-to-chip wiring length and, therefore, is preferred for some applications.

In the third step, the formed panels are cleaned in preparation for plating. In the preferred embodiment of the invention, the panels are cleaned in a warm caustic solution and then treated for 30 to 60 seconds in an oxalic/phosphoric acid solution at a temperature of 80°–100° F. The cleaning process is important to promote bond strength between the metal core and the copper foil which is plated on to the core in the next step. The surface of the metal core material thus must be free of dirt, grease, or other contaminants.

In the fourth step, the core material is plated with copper to improve heat transfer. The plating may be complete plating or selective plating. As discussed in step 2, above, selective plating may be desired to permit direct chip attach to the core material. The plating may be performed in an acid or an additive copper plating bath. Plating with other materials is possible. However, Cu is preferred due to its electrical properties and relatively low cost. Plating is typically performed on both sides of the core material.

The most convenient plating process is acid copper electroplating. Copper is plated on all exposed surfaces of the core material when current is applied to the plating cell. No prior seeding or catalyzing of the surface is required. The plating may either be pattern or full panel, depending on whether or not a resist pattern has been exposed and developed on the core material.

The acid copper solution used contains copper sulfate, sulfuric acid, hydrochloric acid and, depending on the vendor from which the bath is purchased, one or two plating additives which aid in plating bright, level copper. An example of a bath that could be used is Shipley EP-1100, with B-1 additive. Other electrolytic plating baths could be used to deposit metals other than copper on the core. The core's ability to act as a cathode makes it a candidate for plating in any electrolytic bath.

Additive plating baths may also be used to plate copper on the core. However, additive baths do require prior seeding of the core surface. This is typically accomplished with a noble metal colloidal seed, such as Pd, stabilized by Sn. Additive plating may also be used to either full panel or pattern plate. Electrolytic plating has an advantage over additive (or full build electroless plating) in that the current carrying capability of the core is utilized in the plating process.

Experimental tests were performed of plated core materials. Based on the four factors of cross sectioning, thermal analysis data, coefficient of thermal expansion ("CTE") measurements, and cost factors, the most advantageous plating thickness for power cards and supplies was determined to be between 25 and 40 microns. Plating with a foil of a thickness of 35 microns (which is one-ounce foil) is commonly used in the manufacture of printed circuit boards. Plating should be carried out at a low current density to achieve uniform plating thickness and to minimize thermal stresses. The recommended current density is less than or equal to 20 amps per square foot.

In the fifth step, to improve adhesion and stress relief of the copper plated panels, the panels are subjected to heat treatment. The heat treatment is important to ensure adequate bonding of the copper plating with the metal core. Experimental trials were performed to determine the proper heat treatment. A minimum of one hour of heat treatment at 250° C. is most advantageous. The heat treatment process is known as annealing.

Upon completion of steps one through five, the panels are ready to be "personalized" for the intended application. The process of personalizing the panels is known as "circuitization." Circuitization is the sixth step in the process. Circuitization will vary widely depending on the intended application. Among the processes that may be carried out during circuitization are the application of dielectrics and signal line and via plating.

Polymeric dielectrics may be used as insulation layers between the multiple power and signal planes of a multi-layer electronic circuit package. Many dielectric materials are commercially available, including photoimageable ones and nonphotoimageable ones. The dielectric material typically will have a dielectric constant of 3.2 or less to reduce signal propagation delays and to reduce signal noise. The selected dielectric may be applied in one of several ways, including spraying, screening, dipping, or lamination of dry film materials. If screening is performed using a nonphotoimageable dielectric, photoimaged screens should be used to eliminate subsequent drilling to form vias. Dielectric coatings are well-known in the art. See, for example, Brauer, et al., U.S. Pat. No. 5,153,986 and Bindra, et al., U.S. Pat. No. 5,229,550. Examples of suitable dielectrics include, but are not limited to IBM Advanced Solder Mask (ASM), Taiyo PSR4000, polyimide, Dupont Vacrel or the like.

For signal line and via plating, the dielectric surface is seeded with a catalyst. The metal seed layer typically is selected from a group comprising chromium, copper, palladium, tin, or alloys thereof. A photoresist may then be applied to the seeded dielectric surface. The photoresist is imaged and developed such that signal lines and via openings are removed in the photoresist. The via and circuit line plating then is carried out using the plated core as the cathode. The advantage of this is that solid vias may be plated, and selective plating in the photoresist openings also is allowed.

A conventional seeding process, prior to electroless copper, and followed by acid copper, may be used to plate and or fill the vias and the surface layer or pattern. A common seeding process follows a series of steps. These steps consist of a cleaner/conditioner, which cleans the surfaces and conditions non-conductive surfaces for seed deposition. A microetch then cleans any copper surfaces (as well as other metals) and in the process, removes unwanted conditioner from the metal surfaces (minimizing seed deposition). The catalyst deposits a Pd/Sn colloid on all surfaces, in higher concentration on conditioned surfaces, such as the non-conductive ones. The electroless bath will then deposit a thin layer of copper (typically ranging from 40–100 microinches) on all surfaces.

After the seeding and electroless plating, the composite may be acid copper plated, such that an appropriate thickness of copper may be deposited in the vias, and on the surface. Again, the recommended current density will be 20 amps per square foot, or lower to optimize uniformity and to minimize stress.

Solid plated vias provide excellent electrical properties of minimized resistance and inductance in a small cross-sectional area. The solid vias can also lead to a planar surface to which discrete components can be directly attached.

The vias, as defined by the metal seed layers or the dielectric openings, can be filled with an electrically conductive metal material. The metal material is typically the same material as that used for the metal plated layer. The preferred metal material is copper. The vias can be filled using the metal material in a variety of methods, including, for example, electroplating, sputtering, or evaporation. The surface of the layer then may be planarized to remove the excess metal material and the seed metal layer from all areas other than the vias themselves. Planarization typically is done by polishing, such as using a chem-mech polishing technique.

The plated core has the added advantage that it can subsequently serves as a power plane. It is desirable to use the plated metal core as a power plane of the electronic package. The base alloy material defines the overall package coefficient of thermal expansion (CTE), while the plated copper provides for high electrical and thermal conductivity. Further, use of the plated core as a power plane provides an ideal reference plane for the adjacent, plated signal lines, to minimize electrical noise, cross talk, and line impedance. Completion of circuitization yields a single layer metal core electronic package.

In a typical application, multiple layers of metal core packages are interleaved, such as, for example metal core packages for signals, power, and signal/power. Each layer will have a metal core and will be circuitized. Thus, the above steps will be repeated as needed for additional layers needed for a multi-layer electronic circuit package. Proper alignment of layers is discussed in Bindra, et al., U.S. Pat. No. 5,229,550. Multiple layers, once aligned, are laminated together to form a multi-layer electronic circuit package. Additional layers may also be formed sequentially by providing additional dielectric and copper plating layers directly.

Figure 2:
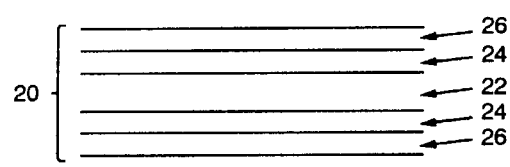
FIG. 2 is a depiction of a single layer of a multi-layer circuit board of the present invention.

FIG. 2 shows an expanded view of a sample single layer of a metal core electronic circuit package 20 of the present invention. In FIG. 2, the metal core material 22 is an iron/nickel alloy that is either 58% Fe/42% Ni; 60% Fe/39% Ni/1% Cu; or 60% Fe/38.7% Ni/0.12% Mn/0.07% Si. The metal core 22 has been formed into panels suitable for the intended application by cutting to size, drilling, etching and/or punching as needed. The metal core 22 also has been cleaned in an oxalic/phosphoric acid solution at a temperature of 80°–100° F. for 30 to 60 seconds.

The metal core 22 is plated with copper plating 24 to improve heat transfer. The plating may be complete or selective plating and may be performed in an acid or an additive copper plating bath. Selective plating will be desired for direct chip attach. The copper plating 24 in the preferred embodiment for power cards and supplies is 25 to 40 microns thick.

The metal core 22, having a copper plating 24, is circuitized using a dielectric material 26 as insulation between the layers of a multi-layer electronic circuit package. The dielectric may be photoimageable or nonphotoimageable and may be applied in one of several ways, including spring, screening, or dipping. Signal line and via plating also may be performed on the electronic package 20 as desired for the intended application.

FIG. 2 shows only a one layer metal core electronic circuit package. The typical high density electronic circuit package will have several such layers interleaved to form a multi-layer electronic package.

What is claimed is:

1. A method for producing a layer of a multi-layer electronic circuit package, comprising the steps of:

selecting a core material from one of three iron/nickel alloys, namely either (i) 58% Fe/42% Ni; (ii) 60% Fe/39% Ni/1% Cu; and (iii) 60% Fe/38.7% Ni/0.12% Mn/0.07% Si;

forming the core material into a panel suitable for an intended application;

cleaning the panel in preparation for plating;

plating the panel with copper;

subjecting the plated panel to heat treatment; and circuitizing the panel for the intended application.

2. A method for producing a layer of a multi-layer electronic circuit package, according to claim 1, wherein the step of forming the core material into a panel further comprises:

applying a photo resist or plating mask to the panel so that some part of the core material will be unplated and suitable for use for direct chip attach.

3. A method for producing a layer of a multi-layer electronic circuit package, according to claim 1, wherein the step of cleaning the panel further comprises:

cleaning the panel in a warm caustic solution; and treating the panels for 30 to 60 seconds in an oxalic/phosphoric acid solution at a temperature of between 80°–100° F.

4. A method for producing a layer of a multi-layer electronic circuit package, according to claim 1, wherein the step of plating the panels further comprises:

plating the panel with copper to a plating thickness of 25 to 40 microns.

5. A method for producing a layer of a multi-layer electronic circuit package, according to claim 1, wherein the step of subjecting the plated panel to heat treatment further comprises:

treating the panel to at least one hour of heat at 250° C.

6. A method for producing a layer of a multi-layer electronic circuit package, according to claim 1, wherein the step of circuitizing the panel for the intended application further comprises:

applying to the plated panel a polymeric dielectric, and performing signal line and via plating.

7. A method for producing a layer of a multi-layer electronic circuit package according to claim 6 wherein the step of performing signal line and via plating further comprises:

seeding the surface of the dielectric with a catalyst;

applying a photoresist;

patterning the photoresist with a via and a first signal plane; and via plating using the plated core as a cathode to plate solid vias.

8. A method for producing a multi-layer electronic circuit package, comprising the steps of:

preparing each layer by
selecting a core material from one of three iron/nickel alloys, namely either (i) 58% Fe/42% Ni; (ii) 60% Fe/39% Ni/1% Cu; and (iii) 60% Fe/38.7% Ni/0.12% Mn/0.07% Si;
forming the core material into a panel suitable for an intended application;
cleaning the panel in preparation for plating;
plating the panel with copper;
subjecting the plated panel to heat treatment;
circuitizing the panel for the intended application; and laminating a plurality of prepared layers to form a multi-layer electronic circuit package suitable for the intended application.

9. A method for producing a layer of a multi-layer electronic circuit package comprising the steps of:

selecting a core material from one of three iron/nickel alloys, namely either (i) 58% Fe/42% Ni; (ii) 60% Fe/39% Ni/1% Cu; and (iii) 60% Fe/38.7% Ni/0.12% Mn/0.07% Si;

forming the core material into a panel suitable for an intended application including the step of applying a photo resist or plating mask to the panel so that some of the core material will be unplated and suitable for use for direct chip attach;

cleaning the panel in a warm caustic solution and treating the panel for 30 to 60 seconds in an oxalic/phosphoric acid solution at a temperature of between 80°–100° F.;

plating the panel with copper to a plating thickness of 25 to 40 microns;

subjecting the plated panel to heat treatment at 250° C. for at least one hour; and;

circuitizing the panel by applying a dielectric and plating vias as appropriate for the intended application.

10. A method for producing a layer of a multi-layer electronic circuit package, according to claim 9, wherein the step of circuitizing the panel further comprises performing via plating using the plated core as a cathode to plate solid vias.

11. A method for producing a multi-layer electronic circuit package, comprising the steps of:

preparing an initial core layer by
selecting a core material from one of three iron/nickel alloys, namely either (i) 58% Fe/42% Ni; (ii) 60% Fe/39% Ni/1% Cu; and (iii) 60% Fe/38.7% Ni/0.12% Mn/0.07% Si;
forming the core material into a panel suitable for an intended application;
cleaning the panel in preparation for plating;
plating the panel with copper;
subjecting the plated panel to heat treatment;
circuitizing the panel for the intended application; and
forming additional circuit layers to define a multi-layer electronic circuit package for the intended application by
applying and patterning one or more additional dielectric layers over the initial core layer; and
seeding and plating additional copper circuit layers over the one or more additional dielectric layers.

12. A method for producing a multi-layer electronic circuit package according to claim 11 wherein the steps of plating the core, circuitizing the core and forming additional circuit layers are performed on one side of the core material.

13. A method for producing a multi-layer electronic circuit package according to claim 11, wherein the steps of plating the core, circuitizing the core, and forming additional circuit layers are performed on both sides of the core material.

* * * * *